(12) United States Patent
Yin et al.

(10) Patent No.: US 8,652,893 B2
(45) Date of Patent: Feb. 18, 2014

(54) SEMICONDUCTOR DEVICE AND MANUFACTURING METHOD THEREOF

(75) Inventors: Huaxiang Yin, Beijing (CN); Qiuxia Xu, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 96 days.

(21) Appl. No.: 13/510,439

(22) PCT Filed: Nov. 25, 2011

(86) PCT No.: PCT/CN2011/001964
§ 371 (c)(1),
(2), (4) Date: May 17, 2012

(87) PCT Pub. No.: WO2013/044427
PCT Pub. Date: Apr. 4, 2013

(65) Prior Publication Data
US 2013/0082362 A1 Apr. 4, 2013

(30) Foreign Application Priority Data
Sep. 29, 2011 (CN) .......................... 2011 1 0300828

(51) Int. Cl.
*H01L 21/336* (2006.01)
*H01L 21/8234* (2006.01)

(52) U.S. Cl.
USPC .... 438/197; 438/513; 438/535; 257/E21.006; 257/E21.077; 257/E21.17; 257/E21.134; 257/E21.267; 257/E21.293; 257/E21.311; 257/E21.329; 257/E21.347

(58) Field of Classification Search
USPC ......... 438/197, 199, 513, 535, 662, 680, 678, 438/724, 744, 757; 257/E21.006, E21.077, 257/E21.134, E21.17, E21.267, E21.293, 257/E21.311, E21.329, E21.347
See application file for complete search history.

(56) References Cited

U.S. PATENT DOCUMENTS

| 7,622,162 B1 * | 11/2009 | van Schravendijk et al. . 427/553 |
| 8,211,510 B1 * | 7/2012 | Varadarajan et al. ......... 427/558 |
| 8,242,028 B1 * | 8/2012 | van Schravendijk et al. . 438/763 |
| 8,512,818 B1 * | 8/2013 | Varadarajan et al. ......... 427/558 |
| 2008/0277730 A1 | 11/2008 | Mehrotra et al. |

FOREIGN PATENT DOCUMENTS

| CN | 1551356 A | 12/2004 |
| CN | 101330022 A | 12/2008 |
| CN | 101584038 A | 11/2009 |

OTHER PUBLICATIONS

International Search Report for PCT/CN2011/001964.

* cited by examiner

*Primary Examiner* — David Nhu
(74) *Attorney, Agent, or Firm* — Troutman Sanders LLP

(57) ABSTRACT

A semiconductor device and its manufacturing method, wherein the NMOS device is covered by a layer of silicon nitride film having a high ultraviolet light absorption coefficient through PECVD, said silicon nitride film can well absorb ultraviolet light when being subject to the stimulated laser surface anneal so as to achieve a good dehydrogenization effect, and after dehydrogenization, the silicon nitride film will have a high tensile stress; since the silicon nitride film has a high ultraviolet light absorption coefficient, there is no need to heat the substrate, thus avoiding the adverse influences to the device caused by heating the substrate to dehydrogenize, and maintaining the heat budget brought about by the PECVD process.

12 Claims, 2 Drawing Sheets

SEMICONDUCTOR DEVICE AND MANUFACTURING METHOD THEREOF

CROSS REFERENCE

This application is a National Stage Application of, and claims priority to, PCT Application No. PCT/CN2011/001964, filed on Nov. 25, 2011, entitled "Semiconductor Device and Manufacturing Method thereof", which claims priority to Chinese Application No. 201110300828.5, filed on Sep. 29, 2011. Both the PCT application and the Chinese application are incorporated herein by reference in their entireties.

FIELD OF THE INVENTION

The present invention relates to a semiconductor device and the manufacturing method thereof, in particular to a structure and method for increasing thin film tensile stress of an MOS device.

BACKGROUND OF THE INVENTION

Strain Channel Engineering for increasing channel carrier mobility plays an important role in CMOS integrated circuits with a feature size smaller or equal to 90 nm. Uniaxial technologies for creating stress are integrated into the device technology. The NMOS and PMOS in a CMOS are covered by stress thin films, which are different from each other in property to increase the carrier mobility in the channel. As shown in FIG. 1, an NMOS 2 and a PMOS 3 are formed on a semiconductor substrate 1, and are insulated from each other through an STI. The thin film 5, which covers NMOS 2, has tensile stress, while the thin film 6, which covers PMOS 3, has compressive stress. Usually, the stress thin films include silicon nitride.

The intrinsic stress in a silicon nitride thin film is mainly caused by the intrinsic property of the nitrogen-centered network structure units in a triangle plane, which tends to form a silicon-centered tetrahedral network structure having a low energy valence bond. The different chemical valences between said two kinds of atoms cause strain. $SiN_xH_y$ with tensile stress is formed by a PECVD process using ammonia-silane as reacting mixture, mainly including the formation of disilane and amino silane group of gas phase, surface reaction of the plasma products, and the subsequent releasing of superfluous hydrogen on the secondary surface through removing reaction of hydrogen and ammonia. The stretched Si—N bond formed in said densifying process will be restricted by the surrounding net texture, and thus will be effectively frozen into a tensile stress state.

The temperature of the substrate in PECVD is lower than that in LPCVD, and hence there is less removing reaction. As a result, the formed thin film contains more Hydrogen composition, the flexibility of the net texture is enhanced and thin film stress is reduced. Therefore, a high temperature surface anneal cure process is required to dehydrogenize and densify the thin film so as to increase its stress. The high temperature surface anneal cure discharges more content of hydrogen element, resulting in higher thin film stress. However, if the temperature is too high, the low temperature advantage and feature of PECVD will be lost, and meanwhile the formed MOSFET silicide and source-drain doping will be affected adversely.

Hence, Ultraviolet Thermal Processing (UVTP) is used to treat the PECVD silicon nitride to increase thin film stress. The energy of the ultraviolet photon helps to break the Si—H bond and N—H bond in the thin film. The hydrogen atoms in adjacent broken bonds is combined to form hydrogen in the form of molecules, which diffuses from the thin film, so that dangling bonds and micropores are formed in the thin film. The dangling bonds cross-link together, so that said micropores contract to minimize surface energy.

The conventional silicon nitride thin film has a small absorption coefficient in a UVTP system, and the substrate needs to be heated to improve the effect of dehydrogenization of the thin film. Therefore, there is a need for a new semiconductor device and manufacturing method, which can obtain a better dehydrogenization effect in the UVTP system without heating the substrate.

SUMMARY OF THE INVENTION

First, the present invention provides a semiconductor device manufacturing method, characterized by comprising:
  providing a semiconductor substrate, on which an NMOS device is formed;
  covering said NMOS device with a silicon nitride film having a high ultraviolet light absorption coefficient through a PECVD process, wherein the ultraviolet light absorption coefficient of the silicon nitride film having a high ultraviolet light absorption coefficient is $\alpha>500\ cm^{-1}$ for ultraviolet light with $\lambda<410$ nm;
  treating said silicon nitride film having a high ultraviolet light absorption coefficient by stimulated laser surface anneal to remove hydrogen from said silicon nitride film having a high ultraviolet light absorption coefficient;
  said silicon nitride film having a high ultraviolet light absorption coefficient that has been subject to the stimulated laser surface anneal treatment having a tensile stress greater than 1 GPa to increase channel carrier mobility of the NMOS device.

In the method provided by the present invention, when treating said silicon nitride film having a high ultraviolet light absorption coefficient by stimulated laser surface anneal, the temperature of the semiconductor substrate is not higher than 300° C.

In the method provided by the present invention, said silicon nitride film having a high ultraviolet light absorption coefficient includes Si-rich silicon nitride, with a chemical formula $Si_{1-x}N_x$, wherein $x<0.5$.

In the method provided by the present invention, said silicon nitride film having a high ultraviolet light absorption coefficient is doped with at least one of carbon, boron, and germanium.

In the method provided by the present invention, said silicon nitride film having a high ultraviolet light absorption coefficient comprises a multi-layered structure, wherein said multi-layered structure includes at least one of carbon, boron, germanium and diamond-like carbon (DLC) ultraviolet light absorption layers.

In the method provided by the present invention, said stimulated laser is quasimolecule laser, including Ar 126 nm, Kr 146 nm, Xe 172 nm, ArF 193 nm, KrF 248 nm, XeBr 282 nm, XeCl 308 nm and XeF 351 nm.

In the method provided by the present invention, said stimulated laser is modulated gas laser or solid laser.

In the method provided by the present invention, said stimulated laser surface anneal treatment uses pulsed laser having a pulse width of 1 ns~1 ms and an energy density greater than 150 mJ/cm².

Next, the present invention also provides a semiconductor device, characterized by comprising:

a semiconductor substrate, on which an NMOS device is formed;

a silicon nitride film having a high ultraviolet light absorption coefficient, which covers said NMOS device through a PECVD process, wherein the ultraviolet light absorption coefficient of the silicon nitride film having a high ultraviolet light absorption coefficient is $\alpha > 500$ cm$^{-1}$ for ultraviolet light with $\lambda < 410$ nm;

wherein said silicon nitride film having a high ultraviolet light absorption coefficient that has been subject to the stimulated laser surface anneal treatment to remove hydrogen having a tensile stress greater than 1 GPa to increase channel carrier mobility of the NMOS device.

In the device provided by the present invention, said silicon nitride film having a high ultraviolet light absorption coefficient includes Si-rich silicon nitride with a chemical formula $Si_{1-x}N_x$, wherein x<0.5.

In the device provided by the present invention, said silicon nitride film having a high ultraviolet light absorption coefficient is doped with at least one of carbon, boron, and germanium.

In the device provided by the present invention, said silicon nitride film having a high ultraviolet light absorption coefficient comprises a multi-layered structure, wherein said multi-layered structure includes at least one of carbon, boron, germanium and diamond-like carbon (DLC) ultraviolet light absorption layers.

The present invention provides a semiconductor device and its manufacturing method, wherein the NMOS device is covered by a layer of silicon nitride film having a high ultraviolet light absorption coefficient, said silicon nitride film can well absorb ultraviolet light when being subject to the stimulated laser surface anneal treatment so as to achieve a good dehydrogenization effect, and after dehydrogenization, the silicon nitride film will have a high tensile stress; since the silicon nitride film has a high ultraviolet light absorption coefficient, there is no need to heat the substrate, thus avoiding the adverse influences to the device caused by heating the substrate to dehydrogenize, and maintaining the heat budget brought about by the PECVD process.

DETAILED DESCRIPTION OF THE PREFERRED EMBODIMENTS

The present invention will be described below by the preferred embodiments shown in the figures. However, it shall be understood that these descriptions are only exemplary, and are not intended to limit the scope of the invention. In addition, descriptions about the known structures and techniques are omitted below so as not to unnecessarily confusing the concept of the present invention.

Figure 1:
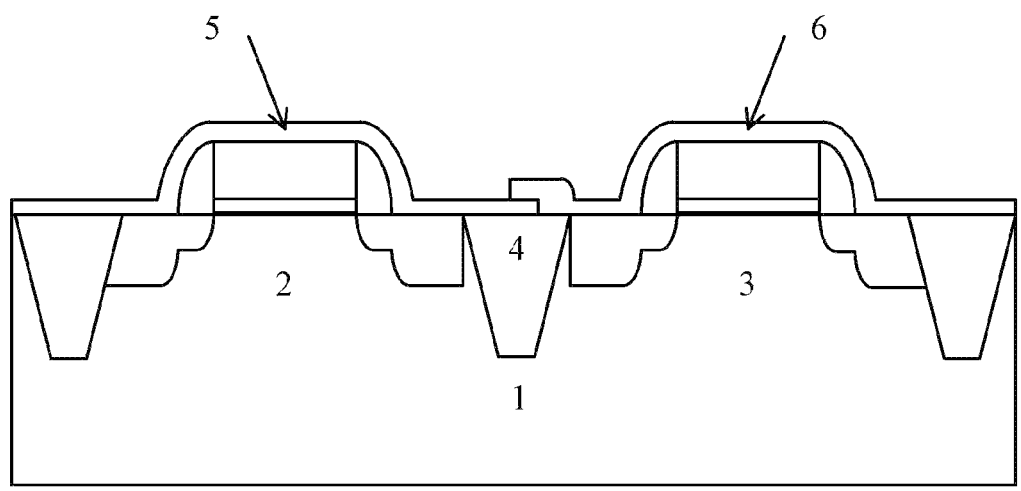
FIG. 1 shows a common strain channel engineering structure.
Figure 2:
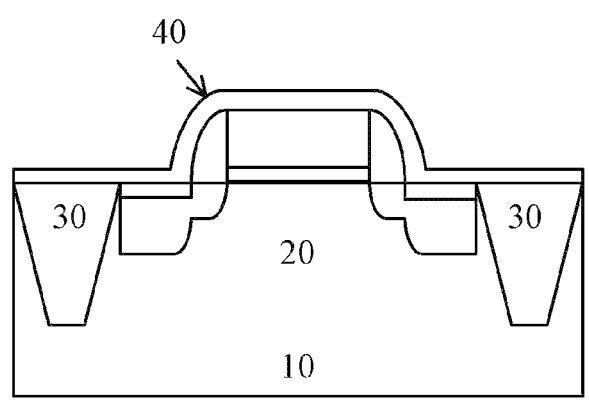
FIG. 2 shows forming an NMOS on a semiconductor substrate and covering it with a silicon nitride film.
Figure 3:
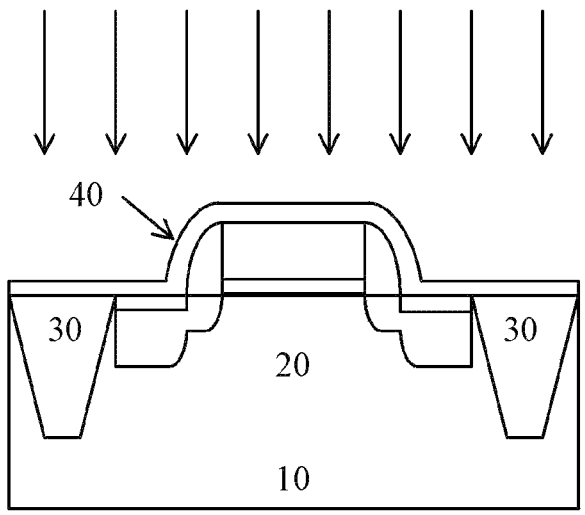
FIG. 3 shows removing hydrogen by stimulated laser surface anneal treatment.
Figure 4:
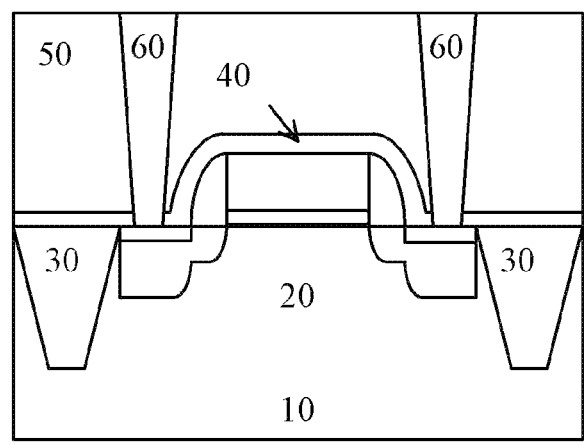
FIG. 4 shows the finished NMOS device.

The present invention provides a semiconductor device manufacturing method, as shown in FIGS. 2-4.

First, a semiconductor substrate 10 is provided, on which an NMOS device 20 and an STI structure 30 are formed, as shown in FIG. 2.

Wherein, the semiconductor substrate 10 is a monocrystalline silicon substrate or SOI. The NMOS device 20 and the STI structure 30 can be formed by the known CMOS process in the art.

Then, a silicon nitride film having a high ultraviolet light absorption coefficient is deposited on the substrate 10 through a PECVD process. Then, lithography is performed so that only the NMOS device 20 is covered by the nitride film 40 having a high ultraviolet light absorption coefficient. Said high ultraviolet light absorption coefficient of silicon nitride film refers to an absorption coefficient $\alpha$ that is larger than 500 cm$^{-1}$, i.e. $\alpha > 500$ cm$^{-1}$, for ultraviolet light with $\lambda < 410$ nm. Alternatively, the silicon nitride film 40 having a high ultraviolet light absorption coefficient may be a Si-rich silicon nitride film, with chemical formula $Si_{1-x}N_x$, x<0.5, or the silicon nitride film 40 having a high ultraviolet light absorption coefficient can be doped with at least one of carbon, boron, and germanium to obtain good ultraviolet light absorption property. In addition, the silicon nitride film 40 having a high ultraviolet light absorption coefficient may comprise a multi-layered structure, which includes at least one of carbon, boron, germanium and diamond-like carbon (DLC) ultraviolet light absorption layers, to increase the amount of ultraviolet light absorbed by the silicon nitride film 40.

After forming the silicon nitride film 40 having a high ultraviolet light absorption coefficient that covers the NMOD device 20, the silicon nitride film 40 having a high ultraviolet light absorption coefficient is treated by stimulated laser surface anneal to remove hydrogen from the silicon nitride film 40 having a high ultraviolet light absorption coefficient, as shown in FIG. 3, in which arrows indicates the stimulated laser surface anneal treatment. As described before, the PECVD process is used to form the silicon nitride film 40 having a high ultraviolet light absorption coefficient because the low temperature in PECVD will not cause any adverse influence to the formed device. However, due to the low temperature, hydrogen contained in the silicon nitride film cannot be removed to a large extent when it is formed by PECVD. So the surface anneal treatment is needed to remove hydrogen from the silicon nitride film and to densify the silicon nitride film, to increase thin film stress. As the silicon nitride film according to the present invention has a high ultraviolet light absorption coefficient, when it is treated by stimulated laser surface anneal, the Si—H bond and the N—H bond in the silicon nitride film 40 can be broken effectively by the photon of the ultraviolet light. The hydrogen atoms in adjacent broken bonds form hydrogen in a molecule form, which diffuses from the thin film. As a result, dangling bonds and micropores are formed in the thin film. The dangling bonds cross-link together, so that said micropores contract to minimize surface energy. A good dehydrogenization effect is achieved without the need to heat the substrate 10 during the whole process. Thus it is possible to avoid the adverse influences to silicide of the formed MOS device and source-drain doping by conventional high temperature surface anneal, maintaining heat budget brought about by the PECVD process. In the method provided by the present invention, the temperature for treating the silicon nitride film 40 having a high ultraviolet light absorption coefficient by stimulated laser surface anneal is not high, and for example the temperature of the semiconductor substrate 10 is not higher than 300° C.

In the method provided by the present invention, quasimolecule laser may be used to stimulated laser surface anneal, including for example, Ar 126 nm, Kr 146 nm, Xe 172 nm, ArF 193 nm, KrF 248 nm, XeBr 282 nm, XeCl 308 nm and XeF 351 nm. Moreover, the stimulated laser may be modulated gas laser or solid laser, with a wavelength less than 410 nm. The stimulated laser surface anneal treatment may use pulsed laser having a pulse width of 1 ns~1 ms and energy density greater than 150 mJcm². The silicon nitride film having a high ultraviolet light absorption coefficient that has been subject to the stimulated laser surface anneal has a tensile stress greater than 1 GPa so as to increase the channel carrier mobility of the NMOS device.

Next, as shown in FIG. 4, after the stimulated laser surface anneal treatment, an interlayer dielectric layer 50 is formed on the substrate 10; via holes are formed in the interlayer dielectric layer 50, and said via holes are filled with a conductive material to form conductive plugs 60 connected to source and drain electrodes, then the subsequent processing is performed. So far, the manufacturing method of the present invention has been clearly described.

The present invention also provides a semiconductor device, as shown in FIG. 4. Said semiconductor device comprises a semiconductor substrate 10, on which an NMOS device 20 and an STI structure 30 are formed; a silicon nitride film 40 having a high ultraviolet light absorption coefficient. The silicon nitride film 40 covers the NMOS device 20 and is formed by a PECVD process. For ultraviolet light with λ<410 nm, the ultraviolet light absorption coefficient of the silicon nitride film having a high ultraviolet light absorption coefficient is α>500 cm$^{-1}$. The silicon nitride film having a high ultraviolet light absorption coefficient that has been subject to stimulated laser surface anneal to remove hydrogen has a tensile stress greater than 1 GPa so as to increase the channel carrier mobility of the NMOS device. In the device provided by the present invention, the silicon nitride film 40 having a high ultraviolet light absorption coefficient may be a Si-rich silicon nitride film, with chemical formula $Si_{1-x}N_x$, x<0.5; the silicon nitride film 40 having a high ultraviolet light absorption coefficient may be doped with at least one of carbon, boron, and germanium to obtain high ultraviolet light absorption property. In addition, the silicon nitride film 40 having a high ultraviolet light absorption coefficient comprises a multi-layered structure, which has at least one of carbon, boron, germanium and diamond-like carbon (DLC) ultraviolet light absorption layers, to increase the amount of the ultraviolet light absorbed by the silicon nitride film 40.

In the present invention, the NMOS device is covered by a layer of silicon nitride film having a high ultraviolet light absorption coefficient through PECVD. The silicon nitride film can absorb a large amount of ultraviolet light when being subject to stimulated laser surface anneal so as to achieve a good dehydrogenization effect. After dehydrogenization, the silicon nitride film has a high tensile stress. Since the silicon nitride film has a high ultraviolet light absorption coefficient, there is no need to heat the substrate, thus avoiding the adverse influences to the device caused by heating the substrate to dehydrogenize, and maintaining heat budget brought about by the PECVD process.

The present invention is described in the above with reference to the embodiments of the present invention. However, these embodiments are only for illustrating the present invention instead of limiting the scope of the present invention. The scope of the present invention is defined by the attached claims and their equivalents. Those skilled in the art can make many substitutions and modifications without departing from the scope of the present invention, so all these substitutions and modifications should falls within the scope of the present invention.

What is claimed is:

1. A method for manufacturing a semiconductor device, the method comprising:

providing a semiconductor substrate, on which an NMOS device is formed;

covering said NMOS device with a silicon nitride film having a high ultraviolet light absorption coefficient through a PECVD process, wherein the ultraviolet light absorption coefficient of the silicon nitride film having a high ultraviolet light absorption coefficient is α>500 cm−1 for ultraviolet light with λ<410 nm;

treating said silicon nitride film having a high ultraviolet light absorption coefficient by stimulated laser surface anneal to remove hydrogen from said silicon nitride film having a high ultraviolet light absorption coefficient;

said silicon nitride film having a high ultraviolet light absorption coefficient that has been subject to the stimulated laser surface anneal treatment having a tensile stress greater than 1 GPa to increase channel carrier mobility of the NMOS device.

2. The method according to claim 1, characterized in that when treating said silicon nitride film having a high ultraviolet light absorption coefficient by stimulated laser surface anneal, the temperature of the semiconductor substrate is not higher than 300° C.

3. The method according to claim 1, characterized in that, said silicon nitride film having a high ultraviolet light absorption coefficient includes Si-rich silicon nitride, with a chemical formula Si1-xNx, wherein x<0.5.

4. The method according to claim 1, characterized in that said silicon nitride film having a high ultraviolet light absorption coefficient is doped with at least one of carbon, boron, and germanium.

5. The method according to claim 1, characterized in that said silicon nitride film having a high ultraviolet light absorption coefficient comprises a multi-layered structure, wherein said multi-layered structure includes at least one of carbon, boron, germanium and diamond-like carbon (DLC) ultraviolet light absorption layers.

6. The method according to claim 1, characterized in that said stimulated laser is quasimolecule laser, including Ar 126 nm, Kr 146 nm, Xe 172 nm, ArF 193 nm, KrF 248 nm, XeBr 282 nm, XeCl 308 nm and XeF 351 nm.

7. The method according to claim 1, characterized in that said stimulated laser is modulated gas laser or solid laser.

8. The method according to claim 1, characterized in that said stimulated laser surface anneal treatment uses pulsed laser having a pulse width of 1 ns~1 ms and an energy density greater than 150 mJ/cm2.

9. A semiconductor device, comprising:

a semiconductor substrate, on which an NMOS device is formed;

a silicon nitride film having a high ultraviolet light absorption coefficient, which covers said NMOS device through a PECVD process, wherein the ultraviolet light absorption coefficient of the silicon nitride film having a high ultraviolet light absorption coefficient is α>500 cm−1 for ultraviolet light with λ<410 nm;

wherein said silicon nitride film having a high ultraviolet light absorption coefficient that has been subject to the stimulated laser surface anneal treatment to remove hydrogen having a tensile stress greater than 1 GPa to increase channel carrier mobility of the NMOS device.

10. The device according to claim 9, characterized in that said silicon nitride film having a high ultraviolet light absorption coefficient includes Si-rich silicon nitride with a chemical formula Si1-xNx, wherein x<0.5.

11. The device according to claim 9, characterized in that said silicon nitride film having a high ultraviolet light absorption coefficient is doped with at least one of carbon, boron, and germanium.

12. The device according to claim 9, characterized in that said silicon nitride film having a high ultraviolet light absorption coefficient comprises a multi-layered structure, wherein said multi-layered structure includes at least one of carbon, boron, germanium and diamond-like carbon (DLC) ultraviolet light absorption layers.

* * * * *